US00RE43552E

(19) United States
(12) Reissued Patent
Roth et al.

(10) Patent Number: US RE43,552 E
(45) Date of Reissued Patent: Jul. 24, 2012

(54) BLOCK PROGRAMMABLE PRIORITY ENCODER IN A CAM

(75) Inventors: Alan Roth, Leander, TX (US); Sean Lord, Stittsville (CA); Robert McKenzie, Toronto (CA); Dieter Haerle, Villach (AT); Steven Smith, Wakefield (CA)

(73) Assignee: Mosaid Technologies Incorporated, Ottawa (CA)

(21) Appl. No.: 12/709,198

(22) Filed: Feb. 19, 2010

Related U.S. Patent Documents

Reissue of:
(64) Patent No.: 7,334,093
Issued: Feb. 19, 2008
Appl. No.: 11/673,703
Filed: Feb. 12, 2007

U.S. Applications:
(63) Continuation of application No. 10/724,576, filed on Dec. 1, 2003, now Pat. No. 7,188,211.

(60) Provisional application No. 60/429,559, filed on Nov. 29, 2002.

(51) Int. Cl.
*G06F 12/00* (2006.01)

(52) U.S. Cl. ..... 711/158; 711/108; 365/200; 365/236
(58) Field of Classification Search ..... 711/158, 711/108; 365/200, 236
See application file for complete search history.

(56) References Cited

U.S. PATENT DOCUMENTS

| | | | |
|---|---|---|---|
| 5,530,798 | A | 6/1996 | Chu et al. |
| 6,687,785 | B1 | 2/2004 | Pereira |
| 6,697,276 | B1 | 2/2004 | Pereira et al. |
| 6,700,809 | B1 | 3/2004 | Ng et al. |
| 2003/0016575 | A1 | 1/2003 | Regev |
| 2004/0128440 | A1 | 7/2004 | Regev et al. |

*Primary Examiner* — Matthew Bradley
(74) *Attorney, Agent, or Firm* — Dennis R. Haszko

(57) ABSTRACT

A priority encoder (PE) for a CAM, comprising a plurality of PE blocks, each receiving a plurality of match results corresponding to data entries in a corresponding data array block and, for determining an address of a highest priority data entry based on a physical location in the data array block during a CAM search-and-compare operation a register for storing a user defined priority value assigned to each PE block and means for evaluating priority values and the address determined by the plurality of PE blocks to select a PE block having the highest priority data entry.

54 Claims, 10 Drawing Sheets

BLOCK PROGRAMMABLE PRIORITY ENCODER IN A CAM

Matter enclosed in heavy brackets [ ] appears in the original patent but forms no part of this reissue specification; matter printed in italics indicates the additions made by reissue.

CROSS REFERENCE TO RELATED APPLICATIONS

This application is a continuation of U.S. patent application Ser. No. 10/724,576, filed on Dec. 1, 2003, now U.S. Pat. No. 7,188,211, which claims priority from U.S. Provisional Patent Application Ser. No. 60/429,559, filed Nov. 29, 2002, which is incorporated herein by reference in its entirety.

FIELD OF THE INVENTION

The invention relates to the field of electronic circuits, and more specifically to a priority encoder circuit for use in a content addressable memory (CAM).

BACKGROUND OF THE INVENTION

Content addressable memories (CAMs) are a specific type of associative memory device. A typical application of a CAM is in network routers and switches which use a CAM or a series of CAMs to shorten routing processing time. Before the introduction of Classless InterDomain Routing (CIDR) lookups were done easily with the comparison of fixed length prefixes. However with the introduction of CIDR and Longest Prefix Matching (LPM), instead of searching for a fixed length matching network address, to find the corresponding next hop address for an IP destination address, the longest prefix which has the most specific routing information is selected.

In order to perform the lookup, the CAM takes a search word and performs a search-and-compare operation for that search word through the entries stored in the CAM. A highest priority entry among matching entries is selected and an address corresponding to the selected entry is output. The determination of the highest priority entry and its corresponding address signal (termed a match address (MA)) is typically performed by a priority encoder (PE) circuit. The CAM also provides a match flag (MF) signal and a multiple match flag (MMF) signal together with the MA.

Of course the entries in the lookup table have to be initially stored in the table. This is done whenever a new IP address is learned by a router or switch, the router stores the learned IP address into a routing table which is implemented in a CAM. In order to store the learned IP address in the routing table, the processor must find an empty location in the CAM to store the learned IP address. According to the LPM search, exact match IP addresses are usually stored in the highest priority area in a CAM, so that when a subsequent search-and-compare operation is performed, the exact match IP address, among the matching entries, is selected and its corresponding match address is provided as a result. In a CAM, priority is typically determined by the physical location of the address space in which the data is stored. Thus, the highest priority entries are typically placed in the lowest physical addresses space in the CAM.

Accordingly, if an empty location to store data of a higher priority than existing lower priority data is not available, the existing lower priority data must be moved to lower priority locations to make room for the new higher priority data. A transferring operation is repeated until the appropriate priority location to store data is found. These block data transfers takes significant processing overhead in CAMs. In a worst case, it would take the same number of read and write operations as the number of data elements in the CAM to move a block of data.

These repeated operations to prepare an available entry in an appropriate priority area are usually executed in response to an instruction issued from a processor in the router when a new IP address is learned.

Accordingly, a problem with current CAMs is that with an increase in their address space size, the time required to prepare an available empty entry in an appropriate priority area becomes proportionally longer.

One solution is proposed by Johan M. Ditmar ("Ditmar"), in a paper entitled "A Dynamically Reconfigurable FPGA-Based Content Addressable Memory for IP Characterization", Master of Science Thesis in Electronic System Design, Stockholm, 2000. This paper outlines a per-entry explicit priority scheme for a CAM. One of the drawbacks of Ditmar is that the per-entry explicit priority encoding requires a considerable amount of logic circuitry per entry. For example, a typical nine megabyte(9M) CAM with 72-bit entries would require 131, 072 copies of the per-entry circuitry, making the die size and cost prohibitive.

In United States Patent application publication no. 20020161969 (Nataraj et. al) there is described a CAM for storing policy statements. Each policy statement has associated with it a priority number that indicates the priority of the policy statement relative to other policy statements. The priority numbers are separately stored in a priority index table. The priority index table includes priority logic that determines the most significant priority number PNUM from among the policy statements that match an incoming packet during a search and compare operation. This number may be encoded to obtain a physical address to be used as a pointer into a route memory or the priority number may be used directly as pointer into the route memory.

Nataraj can also be used to process IP packets in the CIDR scheme. In this case IP addresses are loaded into CAM cell rows, and the corresponding decoded prefix data are loaded into mask rows. Decoding logic is provided in the CAM device to decode the prefix number. Additionally, the prefix data is encoded into a binary number and stored in corresponding locations in priority memory. Encoding logic can be provided in CAM device to encode the prefix number into a binary (or other code) number.

When a search is performed for the IP address with the longest prefix (i.e., an LPM search), all matching locations in CAM array 404 will assert their corresponding match lines. Priority logic then compares, with each other, the encoded prefix numbers associated with the matching IP address. Priority logic identifies the most significant encoded prefix number (i.e., the highest prefix number), and identifies its location in priority memory. The encoded most significant prefix number may also be output from CAM device. The encoder then encodes the identified location into an address for output.

While Nataraj allows the updating of the CAM array without the need to physically reorder the stored data, it still requires additional encoding and decoding logic to both store data and when comparing data. Furthermore, Nataraj does not describe how to add data to a full CAM.

Consequently, it is an object of the present invention to obviate or mitigate at least some of the above mentioned disadvantages.

SUMMARY OF THE INVENTION

Advantageously, the present invention allows easy insertion of prioritized data to a CAM.

In accordance with this invention there is provided a priority encoder (PE) for a CAM, comprising a plurality of PE blocks, each receiving a plurality of match results corresponding to data entries in a corresponding data array block and, for determining an address of a highest priority data entry based on a physical location in the data array block during a CAM search-and-compare operation a register for storing a user defined priority value assigned to each PE block and means for evaluating priority values and the address determined by the plurality of PE blocks to select a PE block having the highest priority data entry.

In another aspect of the invention there is provided a method for inserting priority data in a CAM having a plurality of data array blocks, the method comprising the steps of determining the priority of the data to be inserted relative to the priority of data stored in the CAM, reading a priority value register associated with each of the blocks, determining a free block for insertion of the data, writing the data to the block and updating the priority value registers to reflect the relative priority of the inserted data.

BRIEF DESCRIPTION OF THE DRAWINGS

Embodiments of the invention may best be understood by referring to the following description and accompanying drawings. In the description and drawings, like numerals refer to like structures and/or processes. In the drawings.

DETAILED DESCRIPTION

In the following description, numerous specific details are set forth to provide a thorough understanding of the invention. However, it is understood that the invention may be practiced without these specific details. In other instances, well-known structures or and/or processes have not been described or shown in detail in order not to obscure the invention. For example a detailed circuit of a CAM search-and compare circuitry is well known and will not be described unless necessary to explain aspects of the present invention. In the description and drawings, like numerals refer to like structures and/or processes.

Figure 1:
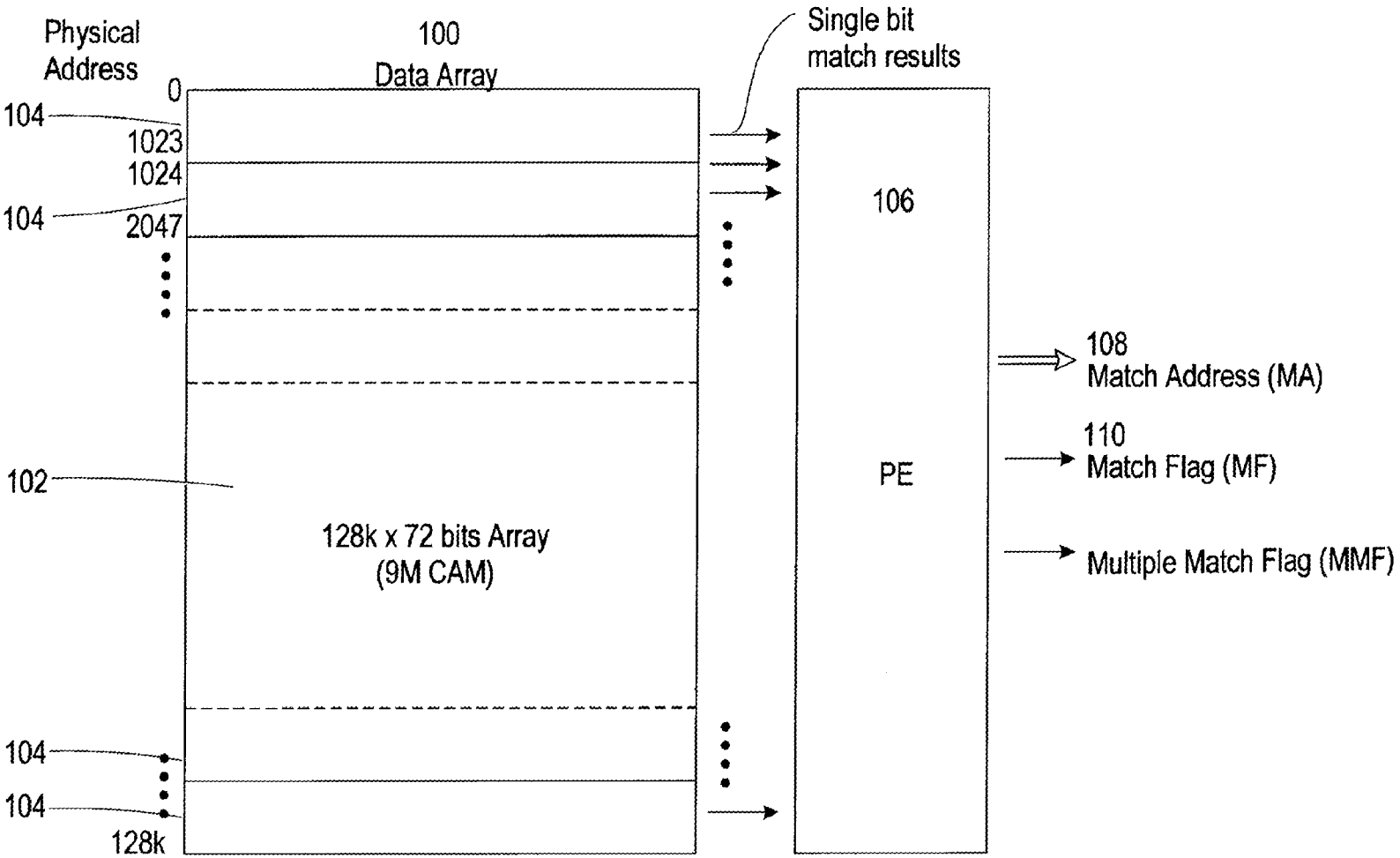
FIG. 1 is a block diagram illustrating a CAM including a data array and a priority encoder in accordance with the prior art.

Referring to FIG. 1 there is shown a typical CAM architecture 100 comprising a data array 102, partitioned into-a plurality of 1 k×72 memory blocks 104 for storing data entries. Each block has a priority encoder PE 106 associated therewith which generates a match address MA 108 corresponding to the highest priority matching entry within that block of entries. The PE 106 also generates a match flag MF 110 along with the MA 108. Although the PE is illustrated as a single block in FIG. 1, it may comprise multiple stages of PE sub-units wherein outputs from each stage of the PE sub-units are cascaded to subsequent stages of PE sub-units until at final stage a final MA and MF result is output. An optional multiple match flag MMF 112 may also be output by the PE.

U.S. patent application Ser. No. 09/984,870, filed Oct. 31, 2001, and entitled "Priority Encoder Circuit and Method For Content Addressable Memory", describes one example of a multi-stage PE implementation and is incorporated herein by reference. As described earlier, one of the disadvantages of the conventional CAM architecture is that insertion of new prioritized data is difficult. This is particularly a problem when the CAM array is full or early full.

In some instances it would be advantageous for a block based CAM array, such as that of FIG. 1, to have a priority scheme whereby each block in the memory array is assigned an explicit priority relative to the other blocks. This priority scheme would change the CAM from an address only based prioritization scheme (also described as an implicit priority scheme), to a more flexible block-based explicit prioritization scheme.

Figure 2:
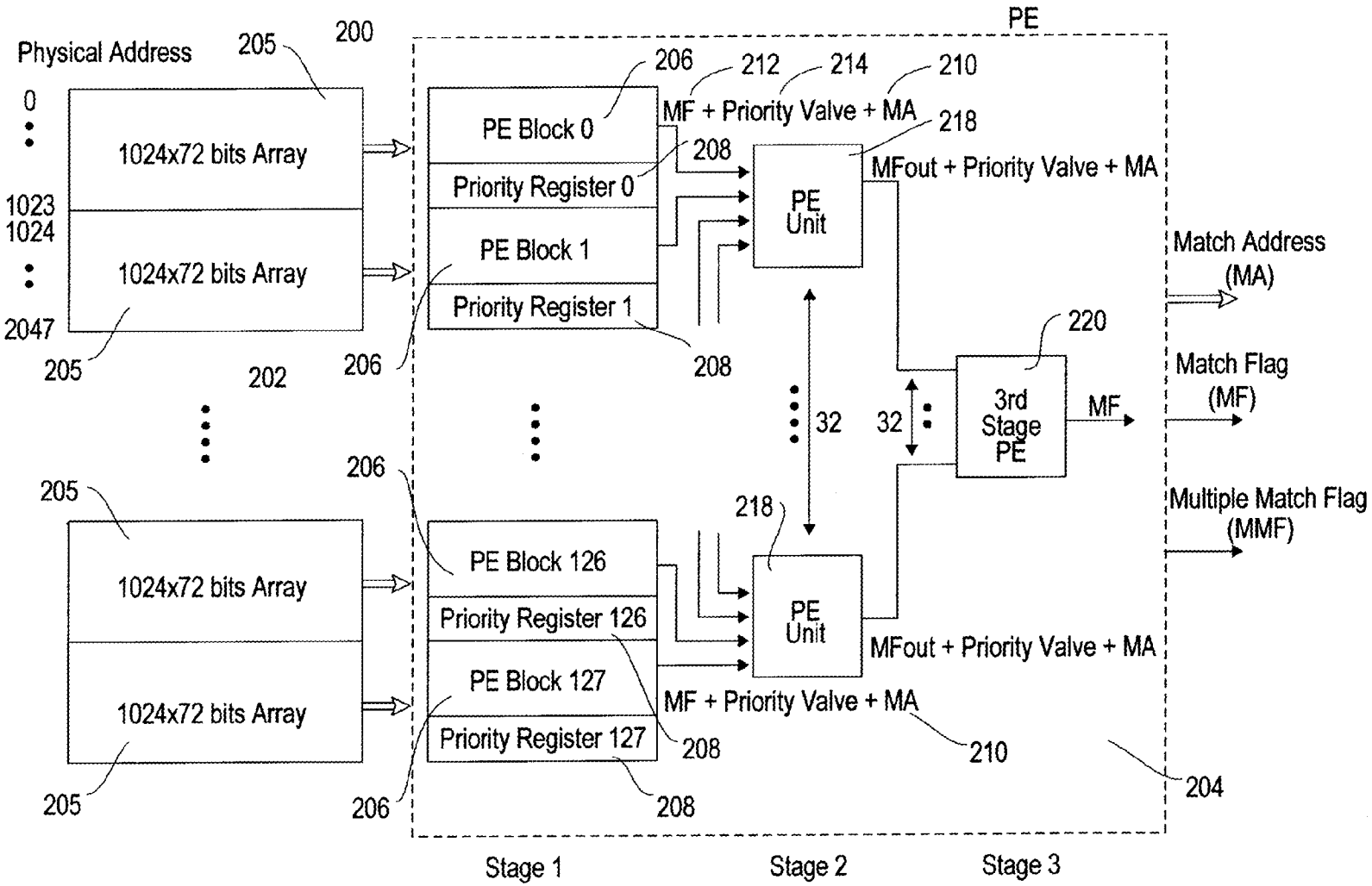
FIG. 2 is a block diagram illustrating a data array and priority encoder in CAM according to an embodiment of the present invention.

Referring now to FIG. 2 there is shown a schematic diagram of a block based priority scheme in a CAM 200 having a 9M data array 202 and a block programmed priority encoder PE 204 according to an embodiment of the present invention. The data array consists of 128 k 72-bit entries (i.e. 72-bit words) and is partitioned into 128 blocks 205 of 1,024 words each. Each block 205 is initially assigned a default priority value of zero ("0"). A user is able to assign a unique priority value to any or all of the blocks so that discrete sections of the CAM can be dynamically re-prioritized without costly block moves involving many read/write operations. In the present invention block reprioritization is achieved by modifying the conventional block priority encoder 206 such that each block priority encoder has associated to it, a priority register 208, to which can be written or read user defined priority values. The read/write lines are not shown for clarity.

The priority of each block 205 can be re-assigned dynamically under predetermined configuration during operation, thereby providing flexible reconfiguration to accommodate a particular application.

Accordingly still referring to FIG. 2, one embodiment of the PE according to the present invention, indicted by the dashed line, is comprised of three stages (stage1, stage2 and stage3) each of which is composed of a plurality of PE sub-units. In a first stage stage1, each PE sub-unit is termed a PE-block and for the example of a 9M CAM there are 128 such PE blocks (PE blocks0, PE Block1. PE Block 127), each of which determines the highest priority entry among 1,024 entries in a corresponding data array block during a search and compare operation. A priority encoder suitable for use in this first stage is described in commonly owned U.S. patent application Ser. No. 09/954,074 (publication number 2002/0042865 Al) entitled "Priority Encoder Circuit and Method", the description of which is incorporated herein by reference.

As shown in FIG. 2, each PE block 206 includes a priority register 208 for storing a unique priority value assigned to that block. In the physical layout of the circuit the priority register is preferably located close to the block and the appropriate stage 1 priority encoder 206. The wiring delays for the data from the priority register will be similar to those of the first stage priority encoders and minimal die area will be taken up for routing signals. However the priority register may be placed anywhere there is space in the layout. The priority register of each block is accessible (via read and write lines) from outside the CAM.

As in a conventional PE, each PE block 206 receives a plurality of matchline signals from its corresponding block 205, and generates a match address MA 210 of the highest priority entry in its data array block. The match address corresponds to that entries physical location in that block. In addition a MF output is enabled with a MF signal 212 and a priority value signal 214 corresponding to that blocks priority value when there is match in a PE block's data array. It may be seen that the first stage essentially consists of 128 of 1024:1 priority encoders.

The MF signal 212, match address 210 and the assigned priority value signal 214 output from each PE block 206 in the first stage, are provided to the input of PE units 218 in the second stage, stage2, of the PE 204. The second stage comprise 32 four input PE units 218. Each PE unit in the second stage determines the highest priority of the received MF signals 212 by comparing priority values 214 provided with the received MF signals. The highest priority MF and priority value is output to a PE unit in a third stage 220. Each of the thirty two outputs from PE units in stage 2 are provided to corresponding ones of 32 inputs of the PE unit in the third stage. The third stage PE 220 determines the highest priority enabled MF by performing the same operation as in PE units in the second stage.

It is to be noted that in the illustrated embodiment the stages are implemented using a cascade of 2:1 priority encoders. Accordingly since the third stage is comprised of a 32:1 PE stage, there are five (5) levels of 2:1 priority encoding. All stages are combinations of 2:1 encoding. It is further noted that the highest priority entry is decided dependent on both a relative priority value for each PE block assigned by a user and a physical address of a matching entry in each PE block. A final address is obtained by combining the selected relative priority value and the physical address, in a manner as more clearly described below.

Figure 3:
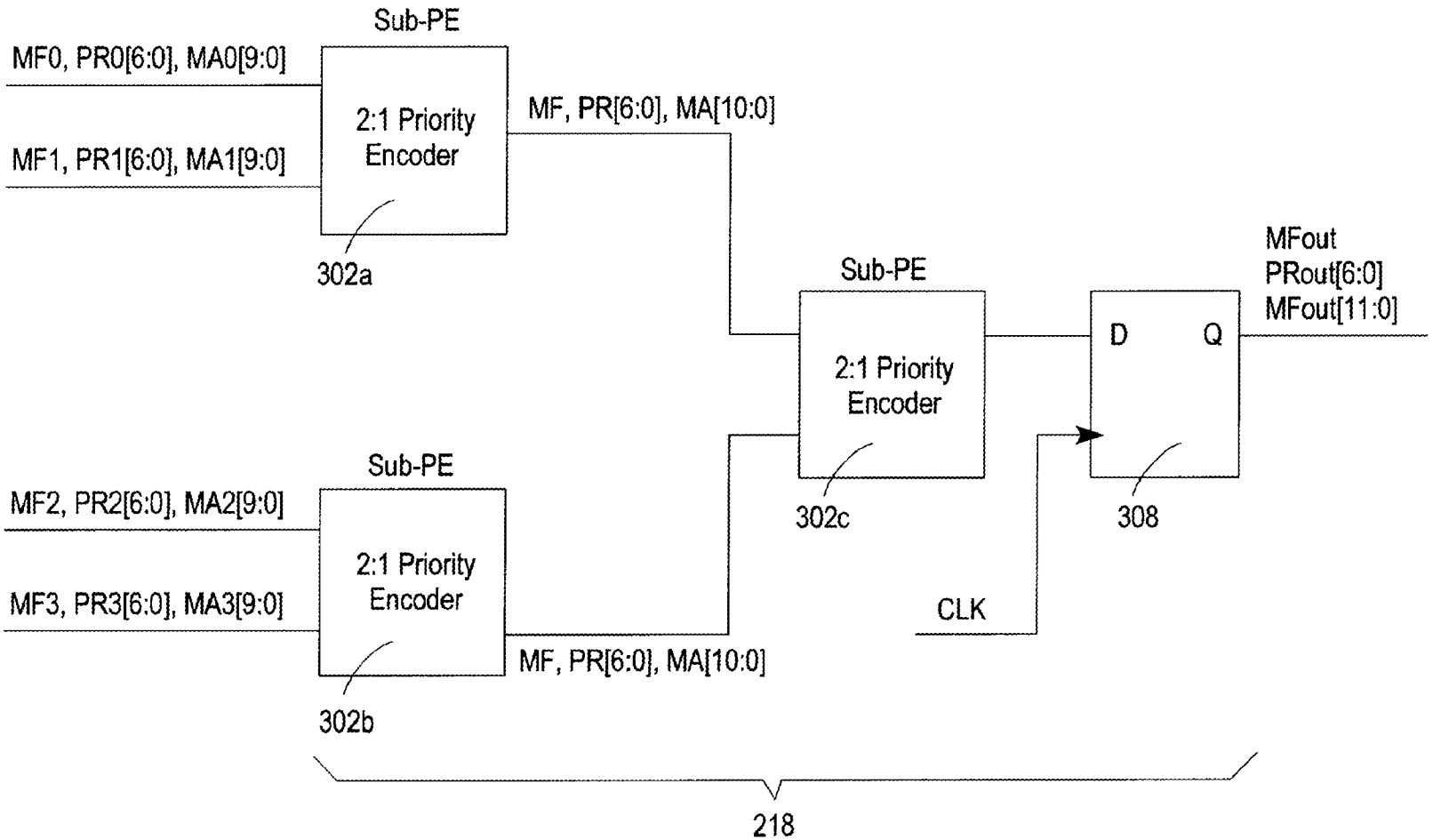
FIG. 3 is a schematic diagram of a 4:1 priority encoder stage according to an embodiment of the invention.

Referring to FIG. 3 there is shown a schematic diagram of the second stage PE unit 218. This stage is essentially a 4:1 decoder having two stages of sub PE's 302 with each stage 302 performing a 2:1 priority encoding operation. The first sub PE 302a receives the match flag 212, the block priority data 214 and the match address signals 210 from block0 and block1. These signals are labeled MF0, PR0[6:0], MA0[9:0] for block0 and MF1, PR1[6:0], MA1[9:0] for block1. The sub PE 302a produces an intermediate result and provides it to one input of the third sub PE 302a. Similarly the second sub PE 302b receives the match flag, the block priority data and the match address from block2 and block3. The signals are labeled MF2, PR2[6:0], MA2[9:0], for block2 and MF3, PR3[6:0], MA3[9:0] for block3. It produces an intermediate result and provides it to another input the third sub PE 302c.

The intermediate results have an extra bit in the match address as one bit of the highest priority match address has been determined by the sub PE's 302a and 302b. The third sub PE 302c provides its output to a D-type latch 308 for enabling pipelining. Those skilled in the art will realize that pipeline stages may be placed elsewhere in the PE to achieve the desired performance and latency. For example, pipelining stages may be placed after each sub PE. The latch clock CLK may then be enabled to synchronize output of the results when appropriate.

The third sub PE 302c provides the match flag output MF out, the priority register output PRout[6:0] and the Match Address output MAout[11:0]. There are now two additional match address bits output from the latch as the priority encoder has selected 1 of 4 blocks as having the highest priority match.

Since there are 1024 words in each block a 10 bit match address is required to identify which row contains the match. Each 2:1 sub PE determines which of its two inputs (block) has the highest priority match an additional most significant bit is appended to the match address. This bit identifies the physical address of the block containing the highest priority match. As there are 128 blocks, a 7 bit priority vector is required to uniquely assign each block a unique priority. So the block can be identified by its priority value or its physical address relative to other blocks.

In alternate embodiments it is possible to have more or less bits than required to uniquely prioritize each block. For example, with fewer priority register bits the second and third stage priority encoder block would be less complex, however the data could only be coarsely prioritized. Alternatively with more priority register bits, the second and third stage priority encoders would be more complex but the data may be prioritized with finer granularity. Having more priority register bits than required to uniquely address all blocks within a CAM would be advantageous in a system which cascaded a plurality of CAMs. Each block within the system could be assigned a unique priority if sufficient priority bits are provided. For example, if the priority register contained 10 bits, seven are required to uniquely identify the 128 blocks contained within the CAM. The other 3 could be used to prioritize blocks in up to 8 different CAMs in a cascaded CAM system.

Figure 4A:
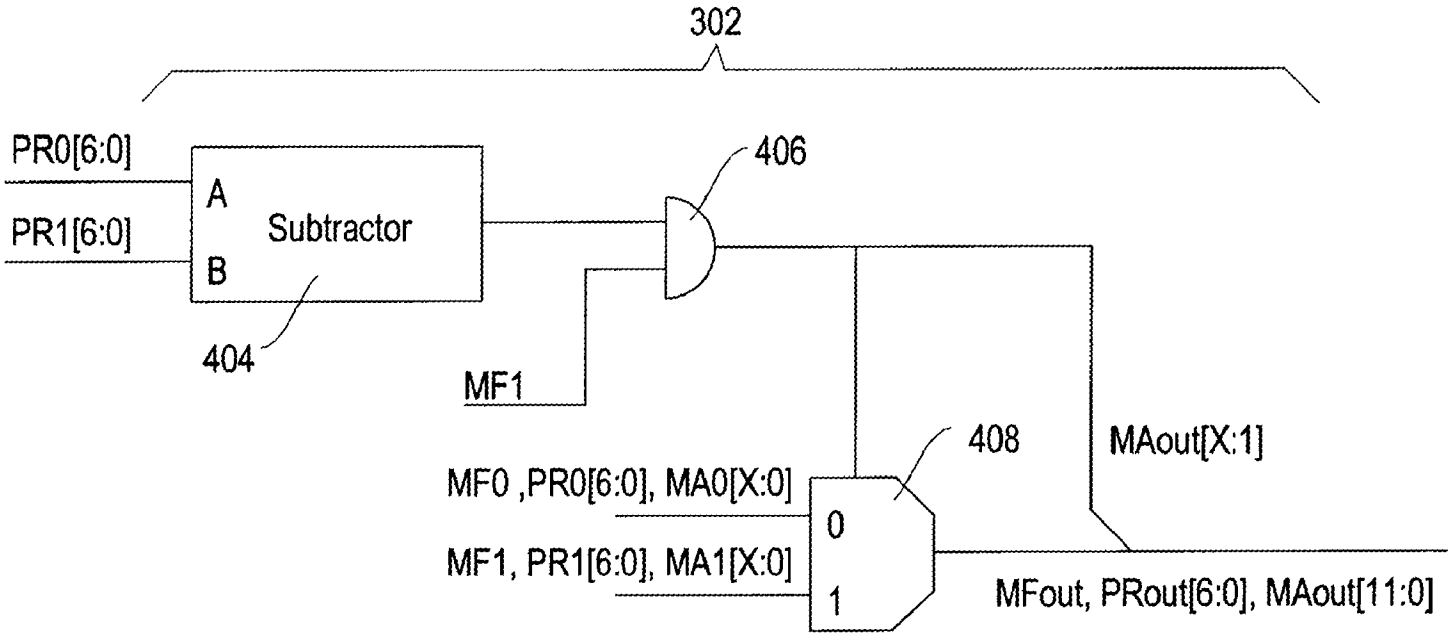
FIG. 4(a) is a schematic diagram of a 2:1 priority encoder.

Referring to FIG. 4a there is shown a circuit diagram for implementing a 2:1 sub PE 302 comprising a subtractor block 404 to which is provided the priority value signals, an AND gate 406 and a multiplexer 408 to which is provided all the signals. For discussion purposes, it is assumed that the signals are the same as those provided to sub PE 302a in FIG. 3. Given that lower physical addresses have higher priority, the match and priority data of the higher physical address block is only passed on if the higher physical block has a match and its priority register is programmed to have a higher priority than the lower physical address block. If the match flag MF1 is low (no match in the higher physical priority block), the output of the AND gate 406 is also low and the MUX 408 selects the match and priority data from the lower physical block. If MF1 is high (there is a match in the higher physical priority block) then there is a possibility that the higher physical block has the higher priority match. The subtractor receives the priority register data PR0[6:0] from the lower physical block on an input A and the priority register data PR1[6:0] from the higher physical block on an input B. The priority value on B is subtracted from A. Its output is high only if the input B has higher priority value (lower number) than input A (i.e. $A-B>0$).

In a CAM where the lower physical address is a higher priority, the subtractor outputs a high if $B<A$. The high output of the subtractor is combined with MF1 by the AND gate 406 and a high is output if MF 1 is also high. This drives the MUX 408 which selects the match and priority data from the higher physical block. If there is a tie (B=A) or A is higher priority (B>A), the subtractor outputs a low and the output of the AND gate 406 is low as well, and the lower physical address match and priority data is passed on by the multiplexer.

Note that the subtractor is only needed if MF 1 is high and therefore MF1 could be used as an enable signal to the subtractor. This would save power. The subtractor is implemented using well known adder circuitry and will not be discussed in detail. While any adder may be used a carry-look-ahead adder is preferred for its speed. The output of the AND gate 406 is appended to the output match address as its most significant bit. Note that ties in the priority register are resolved in the favor of the highest priority block which is the lowest physical address block in this case.

Figure 4B:
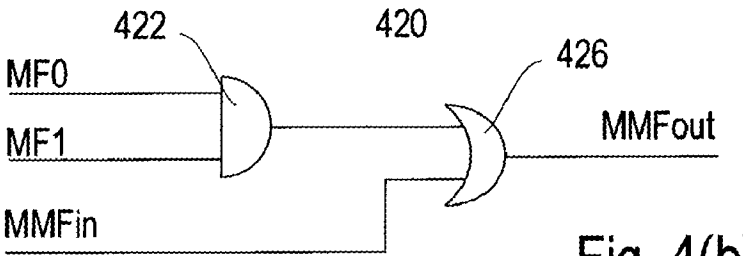
FIG. 4(b) is a schematic diagram of a multiple match flag circuit according to an embodiment of the invention.
Figure 5:
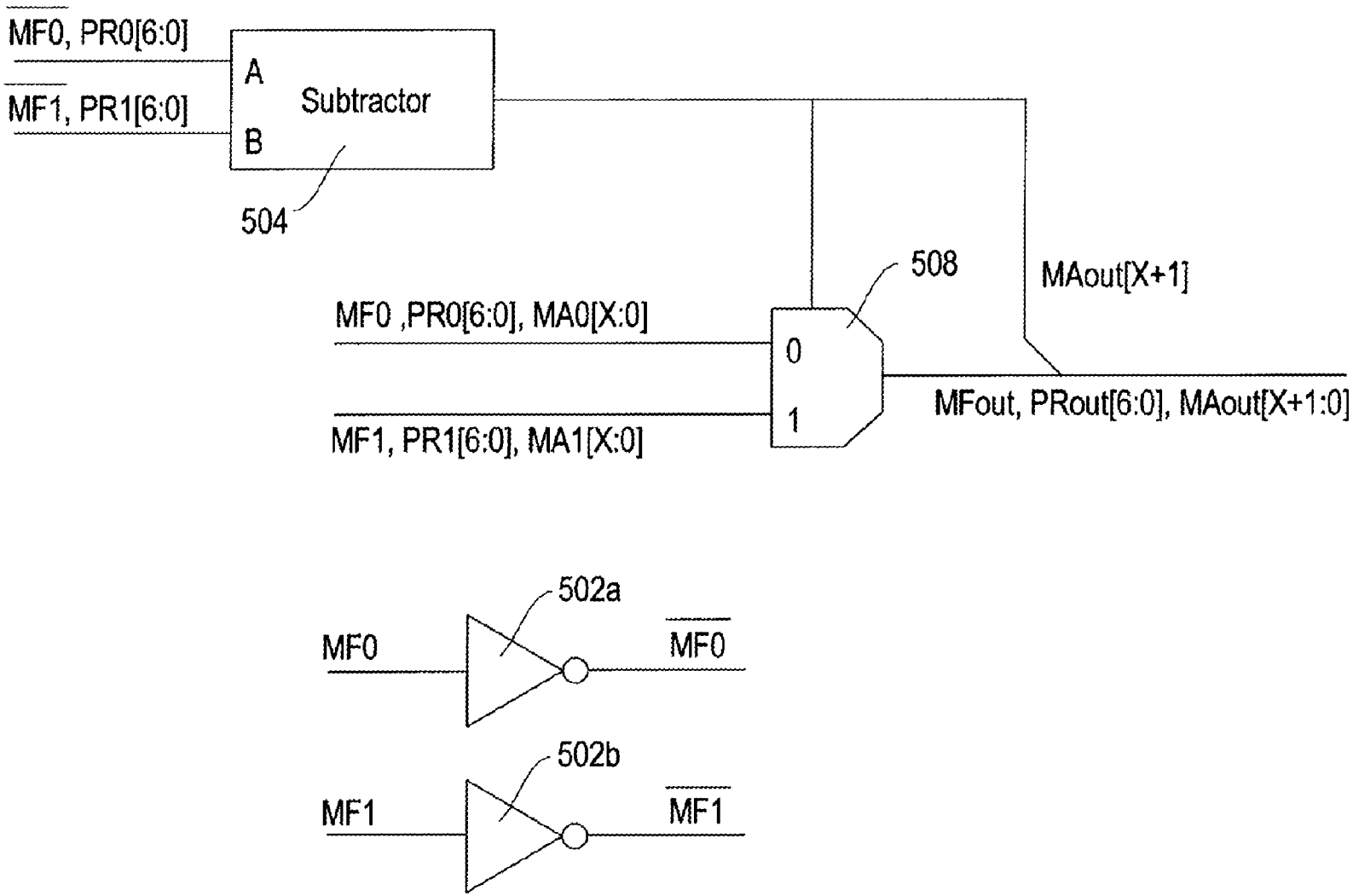
FIG. 5 is a schematic diagram of a 2:1 priority encoder according to a another embodiment of the invention.

Referring to FIG. 4b there shown a diagram of an optional multiple match flag circuit 420 that may be added to the circuits illustrated in FIG. 4a or FIG. 5 An AND gate 422 receives the MF0 and MF1 and provides its output to an OR gate 426. The OR gate 426 receives the multiple match input signal from prior stages MMFin and provides the multiple match flag output MMFout signal. The MMF signal would of course be latched at the appropriate pipelining stages.

Referring to FIG. 5 there is shown an alternate embodiment of a 2:1 sub PE 302. A pair of inverters 502a and 502b provide local inverted versions of the match flags MF0 and MF1. These inverted match flag signals are appended to their respective priority register data as most significant bits. The subtractor's 508 output is high only if B<A. If both blocks contain a match then the inverted match flags will both be 0 and have no effect on the subtraction. Similarly both will have no effect on the determination if both blocks have a miss. However if one block has a hit and the other a miss, the one with the hit will automatically have the higher priority.

The two embodiments of sub PE's described above have been implemented with the traditional approach of lower physical addresses having higher priority. The present invention could equally well be adapted to a CAM where the higher physical addresses have higher priority.

Figure 6:
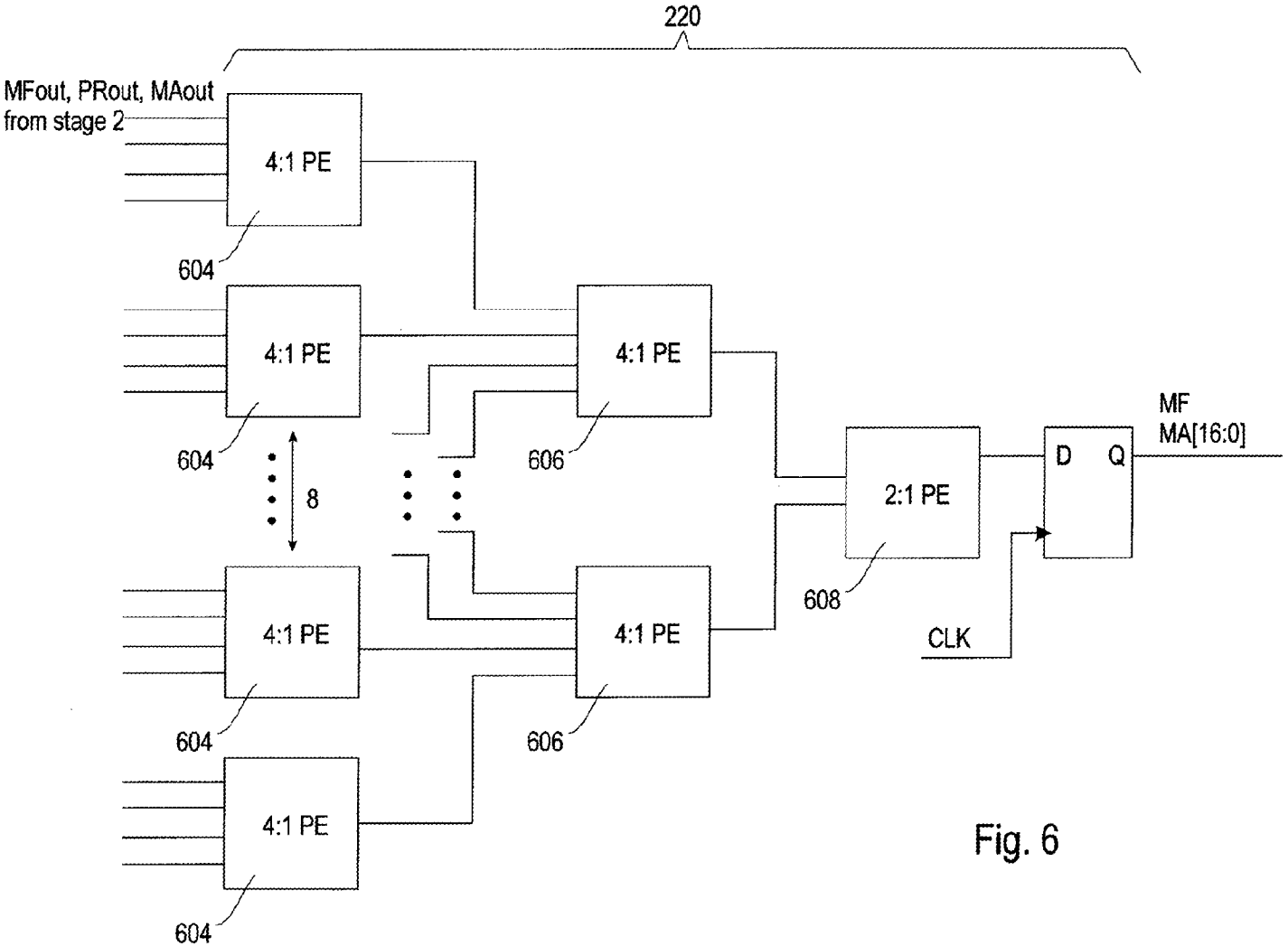
FIG. 6 is a schematic diagram of a 32:1 priority encoder according to a another embodiment of the invention.

Referring to FIG. 6 there is shown a schematic diagram of the third stage PE 220 which performs the final 32:1 priority encoding and match address calculation. The 32 outputs MFout, PRout and MAout from the second stage are coupled to eight 4:1 priority encoders 604 which are preferably similar to those of FIG. 3 with an increase in the number of match address bits provided and, possibly, including pipelining latches. The eight 4:1 PE's 604 have their outputs connected to two additional 4:1 PE's 606 and then to a final 2:1 priority encoder 608 these PE's maybe implemented as illustrated in FIGS. 4 and 5. The 2:1 PE's 608 output is latched in an optional, D-type latch, pipelining stage 610 as illustrated in FIG. 6. The third stage PE 302 provides the match flag output for the entire array MF and a 17-bit match address. Although not shown in the present embodiments the priority register bits PR[6:0] of the highest priority match may also be provided as an output.

Figure 7:
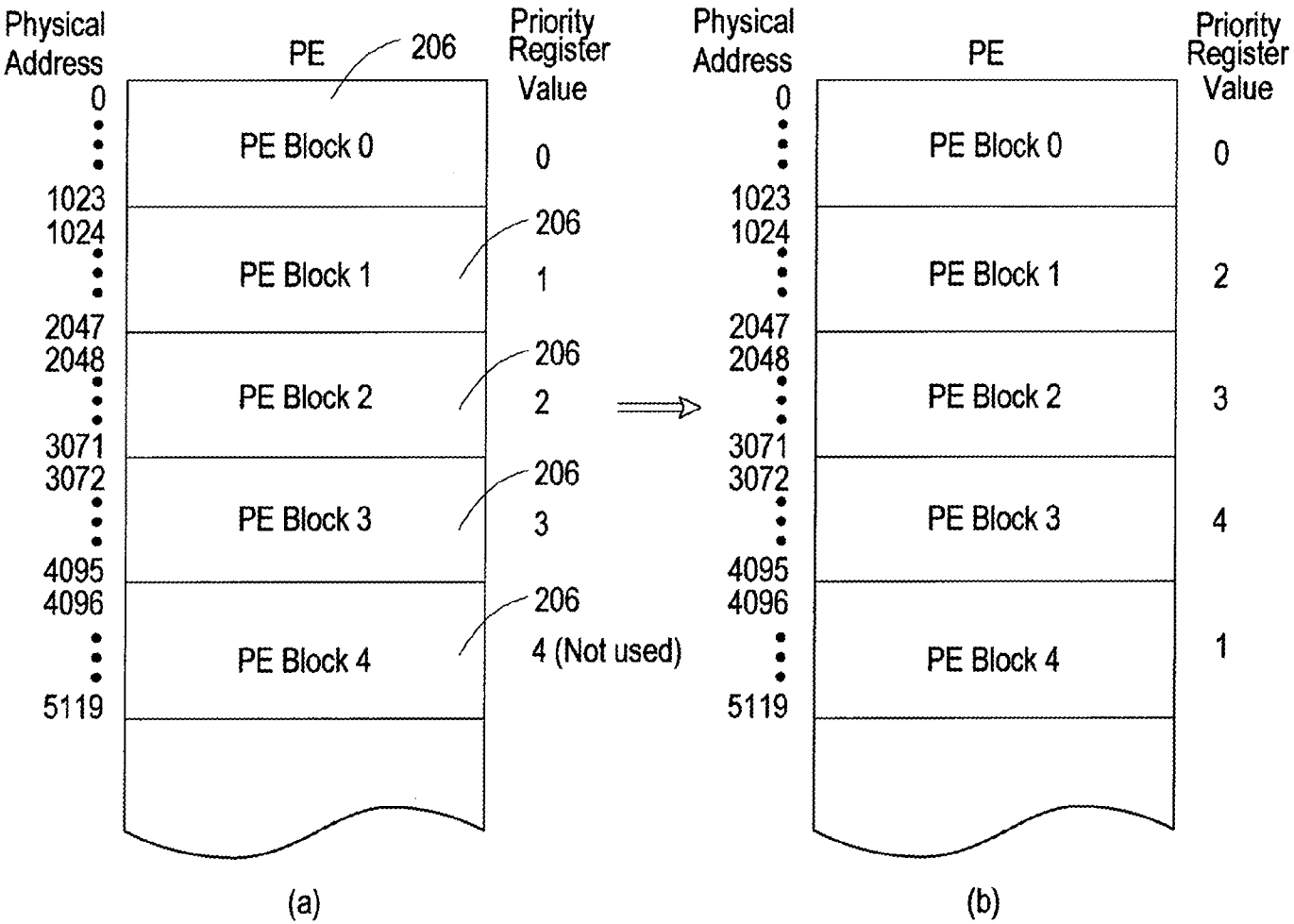
FIGS. 7(a) and (b) are block diagrams illustrating a CAM before and after a write operation in accordance with an embodiment of the invention having five PE blocks with each block being assigned a priority value in the first stage illustrated in FIG. 2.

Referring now to FIG. 7(a) there is shown a simplified first stage of the PE 204 having five PE blocks 206 with each block being assigned a sequential priority value in descending order from '0' to '4' as shown. Priority value '0' is the highest priority. The PE block0 receives matchline signals (not shown) from entries having physical address from 0 to 1,023; PE block1 covers entries having physical addresses from 1,024 to 2,047; PE block2 covers entries having physical addresses from 2,048 to 3,071; PE block3 covers entries having physical addresses from 3,072 to 4,095 and PE block4 covers entries from 4,096 to 5,119. The latter PE-block4 is not used and entries in the corresponding array are empty.

In FIG. 7(a), the PE blocks are shown segmented but a final result obtained from the segmented PE blocks is the same as that in a conventional PE because priority values are assigned in the same order as that of a conventional PE.

Referring to FIG. 7(b) there is shown the PE blocks of FIG. 7(a) with PE block4 having been prepared to participate in a search-and-compare operation after new data has been added to the CAM. This new data is stored in the corresponding data array of PE block4 and is assigned priority value '1' which is the second highest priority value. The remaining 3rd, 4th and 5th highest priority PE blocks are re-assigned accordingly. The priority assignment is performed by the user of the CAM according to the rules/algorithms they choose to use. The new priority assignments are written into each priority register by the user. Note that in a prior art CAM, the data from block3 would have to be moved to block4, and then the data from block2 would have to be moved to block3. Finally data from block1 would have to be moved to block2. Then new data could be entered into blockl at priority "1". This would take up to 3072 read/write operations to make space to add data. Contrast that with the present invention where only four priority register write operations would be required to obtain the table of FIG. 7(b).

Referring to FIG. 8(a) there is shown the first five data array blocks 205 and the priority values assigned to their PE blocks 206 when the CAM data array implements a routing table in a router. The routing table may be implemented in a single CAM or a series of CAMs depending on the number of entries required. The routing table is used to determine the next hop address, which is either an address of the next router or an address of a local network, to which a received packet is to be forwarded. As described earlier IP address lookup is a process of finding a next hop address from a destination IP address. In a LPM the prefix is of a variable length, and the longer a prefix is, the more specific routing information it has. Thus data is stored in the routing table such that "Exact match" IP addresses are stored in the highest priority area in a CAM, which is close to physical address 0; "Next Best match" IP addresses which end with a don't care bit (e.g. "0000 0000 0000 0000 0000 0000 0000 000×B"), are stored in the next two highest priority areas; and "Not So Good Match" IP addresses follow.

In an LPM search comparison is made between a destination IP address and each prefix in the routing table to produce a set of matching prefixes. Among them the longest prefix which has the most specific information is selected. Since IP addresses are stored in the CAM based on the LPM, when multiple matching entries are found in the CAM by a search-and-compare operation, the highest priority entry, that which is placed in the lowest physical address, is selected and its corresponding address is output as the MA.

As shown in FIGS. 7(a) and 8(a) previously, an unused PE block and corresponding empty array are prepared for storing newly learned exact match IP entries. The unused PE block is assigned priority value '1' so that the corresponding data array block has the 2nd highest priority and the learned exact match IP entries are stored in the corresponding array. Other PE blocks for used arrays are re-assigned new priority values '2', '3' and '4', accordingly.

With the present invention, one or more unused PE blocks among the 128 PE blocks are prepared in a pool in the router. When an unused block needs to be used for learned IP addresses, one of the unused PE blocks is taken from the pool and is assigned a priority value according to the type of learned IP addresses that will be stored in it. Blocks used to store "exact match" IP address entries will be assigned a high priority value while blocks used to store "not so good" match IP address entries will be assigned a low priority value. Priorities of other used PE blocks are accordingly re-assigned upon a new PE block being inserted. FIGS. 8(a) and 8(b) illustrate the case where it is desired to assign each block a unique priority value. In alternate embodiments the priorities need not be unique and other used PE blocks are already assigned ties in order of block priority would be resolved based on physical address (ie lowest physical address is highest priority).

Figure 8:
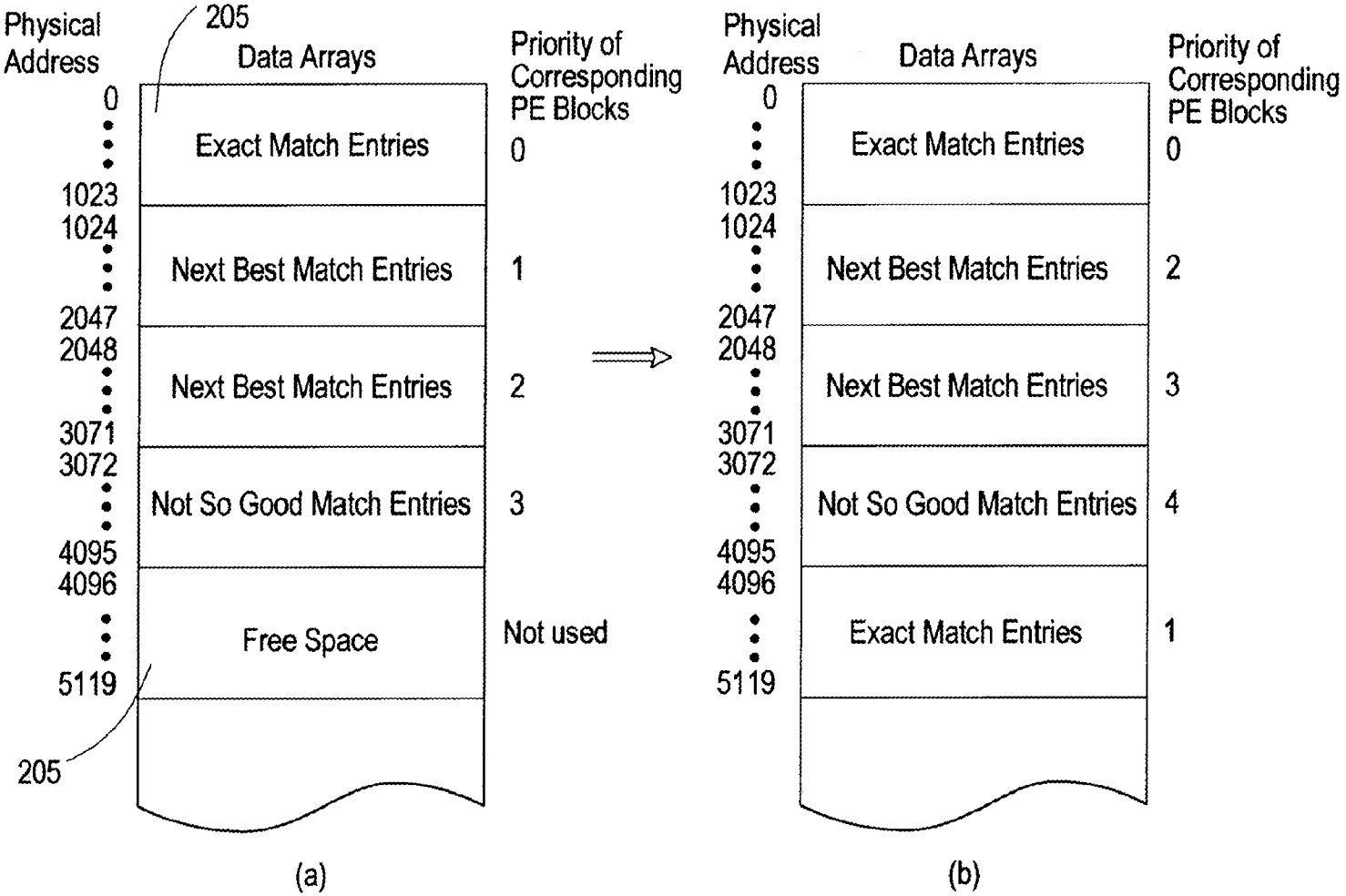
FIGS. 8(a) and (b) are block diagrams illustrating the contents of a CAM array when applied to a routing table in a router in accordance with an embodiment of the invention.
Figure 9:
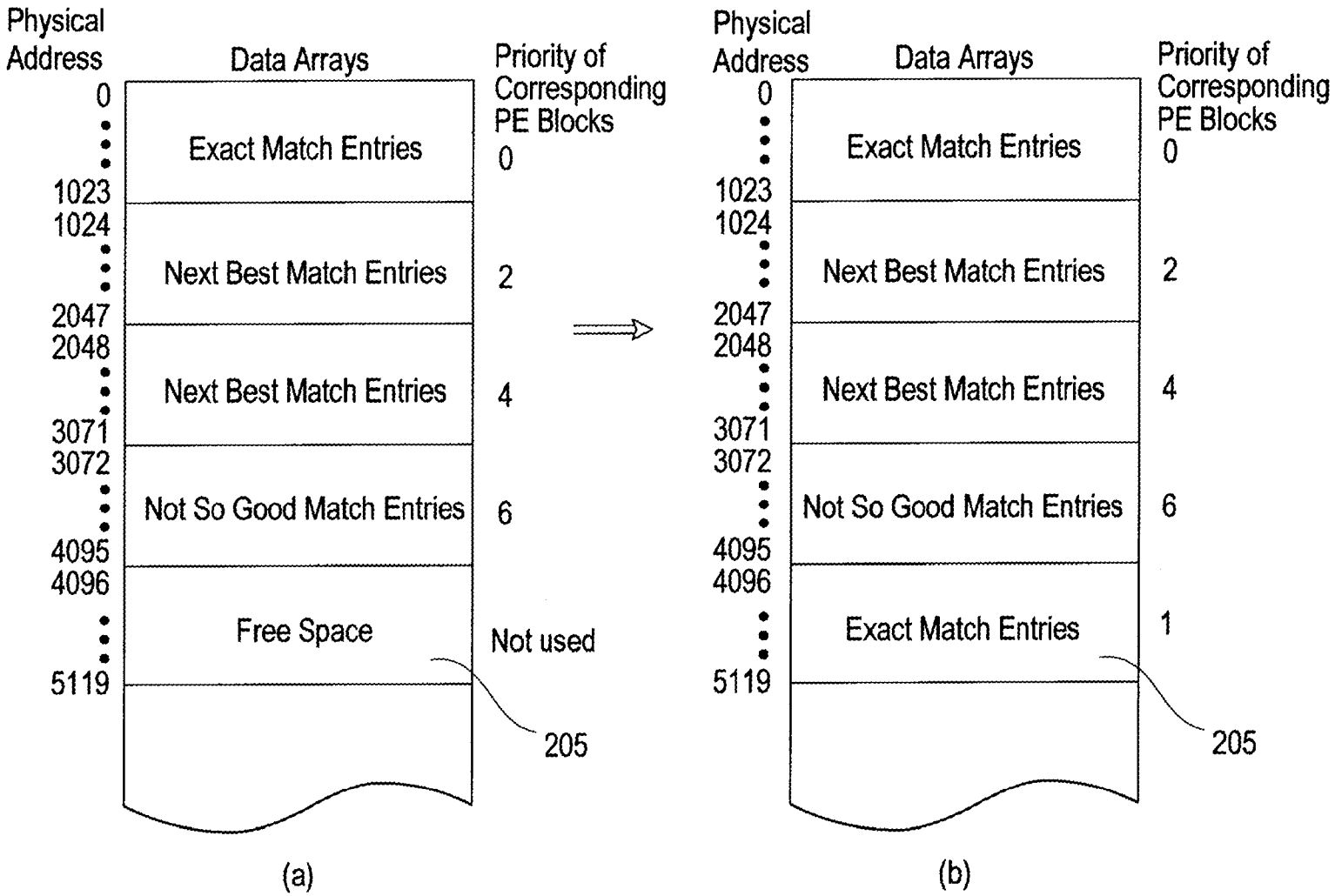
FIGS. 9(a) and (b) are block diagrams illustrating re-assignment of priorities to PE blocks upon insertion of a new PE block in accordance with an embodiment of the invention; and, FIG. 10 is a block diagram illustrating a CAM is accordance with another embodiment of the invention.

Alternatively the initial priority mapping could be set as shown in FIGS. 9(a) and (b). This requires the above mentioned embodiment where more bits are present in the block priority register than are required to uniquely identify each block 205. The 128 blocks require 7 bits to assign unique priority to each block. In FIG. 9(a) 8-bits are used in the priority register. Each block is initialized to an even priority value. Note that block 127 would have an initial priority value of 254 which requires 8-bits. That leaves the odd priorities available to be inserted as required. FIG. 9(b) shows that block4 has been assigned a priority of '1' and therefore entries in it are assigned a priority between that of the entries in block0 and block1. To those skilled in the art it can see be that there are other various combinations possible when 8-bit registers having 256 possible numbers are used for 128 PE blocks.

As described above, only changes of priority values for PE block registers 208 are needed to assign priorities to blocks 205. When a search and compare instruction is executed, newly assigned priority values for PE blocks are used to determine a PE block having the highest priority entry.

The present invention may be applied to existing PE's in other CAM architectures. For example in commonly owned U.S. patent application Ser. No. 10/234,033, filed Aug. 30, 2002, and entitled "Content Addressable Memory Architecture", and incorporated herein by reference, there is described in FIGS. 2A and 2B of that application a CAM architecture having PE circuits where priority is determined dependent on physical location of a matching entry in a sub-block and a position of a sub-block in a row.

Figure 10:
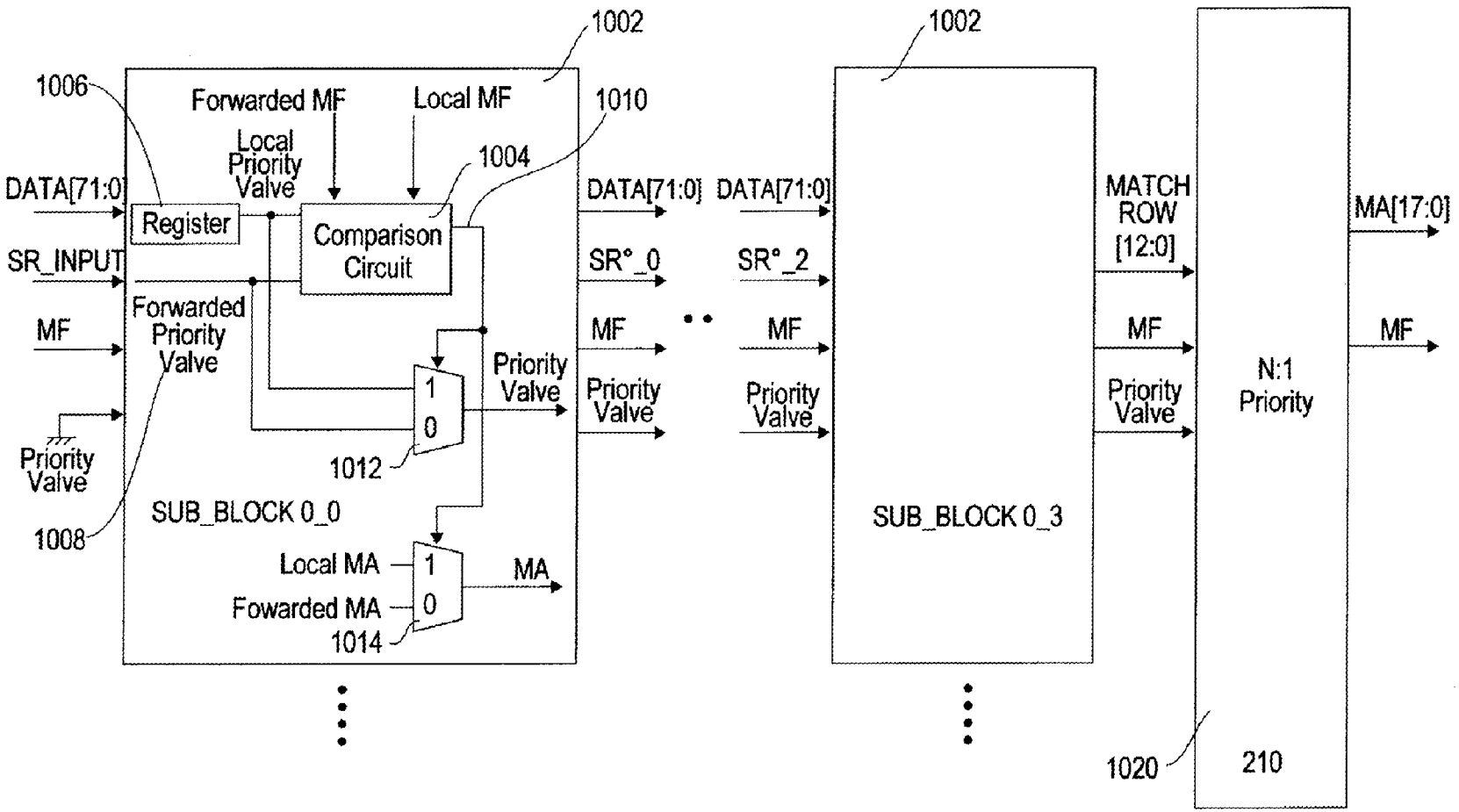

The circuit illustrated in that application may be modified in accordance with the present invention, by adding a programmable register and comparison circuit in each sub-block, as shown in FIG. 10. The highest priority matching entry is selected dependent on priority values in sub-blocks assigned by a user.

Accordingly, referring to the circuit of FIG. 10 there is shown sub-blocks 1002 which include a comparison circuit 1004 that receives a local priority value stored in a programmable register 1006 and a forwarded priority value 1008 from a previous sub-block, to generate a result signal 1010. The result signal 1010 is used to switch respectively multiplexers 1012, 1014 to select a priority value(selected from the local priority value or forwarded priority value) and a match address (MA) (selected from the local MA or forwarded MA) to forward to a next sub-block connected in a row.

If one or more matching entries are found within the sub-block, a local match flag (MF) is enabled. When both a forwarded MF from the previous sub-block and a local MF are enabled, the comparison circuit compares a priority value forwarded from a previous sub-block with a local priority value and outputs a signal to select results to forward. If a forwarded priority value from previous sub-block is higher than a local priority value, the forwarded priority value and associated data including a match address are transferred to next sub-block in the row. If not, the local priority value and associated data are transferred. When either a forwarded MF from the previous sub-block or a local MF is enabled, the forwarded priority value and associated data or the local priority value and associated data are respectively transferred to next sub-block in the row. Forwarded priority values in sub-blocks in the first column are set to nil as shown in FIG. 10 because there is no input priority value from external pins.

A final N to one (N:1) PE 1020 determines the highest matching entry by examining enabled match flags and corresponding priority values propagated across sub-blocks 1002 in each row and outputs a highest priority match address and associated flags.

This embodiment allows the user to revert to the original address-based scheme by assigning the same priority value to all blocks. Alternatively, it is possible by preparing a global configuration register to enable or disable the operation according to the present invention.

The present invention allows users to define priorities of a block of data entries. As a result, it provides a flexible method to define the priority of the entries when a number of entries for a certain IP class in a routing table are being changed. Time required for updating the routing table according to the changed number of entries is reduced because no block transferring procedures to prepare an empty entry are needed. Additionally block based explicit priority encoders can be easily adapted to variable word length CAMs. For example commonly owned U.S. patent application Ser. No. 09/997,296 entitled "Variable Length Multiple Word Searches in a Content Addressable Memory" filed Nov. 30, 2001 describes a CAM in which rows within a CAM array are concatenated to form longer words and is incorporated herein by reference.

In another embodiment the block addresses of each block are dynamically remapped to enable insertion of data within a table. The priority register value 208 is provided to the block select circuitry (not shown) in the address path of the CAM for read and write accesses. The high order bits of the address (block address bits) of a read or write access are compared to the value in the priority register and if they match then that block is selected for the read or write access. Thus the priority register 208 can set the address of the block 205 and the address of a physical block is dynamically remapped. The priority encoders in this embodiment only need to pass on the priority register and the original match address bits of the block as the priority register bits are the block address bits. The final match address consists of the priority register of the highest priority block with a match and the match address within that block. Of course this embodiment requires that each block be assigned a unique priority value in its priority register.

Although preferred embodiments of the invention have been described herein, it will be understood by those skilled in the art that variations may be made thereto without departing from the spirit of the invention or the scope of the appended claims.

What is claimed is:

1. A priority encoder for providing a low physical address match data or a high physical address match data as a highest priority match data, [the low physical address match data having higher priority than the high physical address match data,] comprising:

a multiplexor for passing the high physical address match data as the highest priority match data in response to a first state of a control signal, the multiplexor passing the low physical address match data in response to a second state of the control signal;

logic circuitry for receiving a first priority value corresponding to the low physical address match data and a second priority value corresponding to the high physical address match data, the logic circuitry comparing the first priority value to the second priority value and generating the first state of the control signal if the second priority value is greater than the first priority value.

2. The priority encoder of claim 1, wherein the low physical address match data and the high physical address match data each include a match address and a match flag.

3. The priority encoder of claim 2, wherein the low physical address match data includes the first priority value, and the high physical address match data includes the second priority value.

4. The priority encoder of claim 1, wherein the logic circuitry includes a subtractor for subtracting the first priority value from the second priority value, the subtractor generating the control signal if a difference between the second priority value and the first priority value is greater than 0.

5. The priority encoder of claim 4, further including a logical AND circuit having a first input for receiving the control signal and a second input for receiving a match flag corresponding to the high physical address match data, the logical AND circuit passing the control signal if the match flag corresponds to a match condition for the high physical address match data.

6. A method for providing a low physical address match data or a high physical address match data as a highest priority match data, [the low physical address match data having higher priority than the high physical address match data,] comprising:

a) receiving a first priority value corresponding to the low physical address match data and a second priority value corresponding to the high physical address match data;

b) comparing the first priority value to the second priority value; and, c) passing the high physical address match data as the highest priority match data if the second priority value is greater than the first priority value.

7. The method of claim 6, wherein the step of comparing includes subtracting the first priority value from the second priority value.

8. The method of claim 7, wherein the step of comparing further includes generating a control signal when the second priority value is greater than the first priority value.

9. The method of claim 8, wherein the step of passing includes passing the high physical address match data in response to the control signal.

10. The method of claim 9, wherein the step of generating a control signal includes passing the control signal in response to a logical state of a match flag corresponding to the high physical address match data.

11. The method of claim 10, wherein the control signal is passed with the high physical address match data.

12. The method of claim 6, wherein the low physical address match data and the high physical address match data each include a match address and a match flag.

13. The method of claim 6, wherein the low physical address match data includes the first priority value, and the high physical address match data further includes the second priority value.

*14. The priority encoder of claim 1, wherein the logic circuitry generates the second state of the control signal if the second priority value is less than the first priority value.*

*15. The priority encoder of claim 14, wherein the logic circuitry generates the second state of the control signal if the second priority value is equal to the first priority value.*

*16. The method of claim 6, further comprising passing the low physical address match data as the highest priority match data if the second priority value is less than the first priority value.*

*17. The method of claim 16, further comprising passing the low physical address match data as the highest priority match data if the second priority value is equal to the first priority value.*

*18. A priority encoder for providing a first priority match data or a second priority match data, comprising:*

*a multiplexor for passing the first priority match data as the highest priority match data in response to a first state of a control signal and passing the second priority match data in response to a second state of the control signal;*

*logic circuitry for receiving a first priority match data and a second priority match data, the logic circuitry comparing the first priority match data to the second priority match data and generating the first state of the control signal if the second priority match data is greater than the first match data and generating the second state of the control signal if the second priority match data is less than or equal to the first priority match data.*

*19. The priority encoder of claim 18, wherein the first priority match data and the second priority match data each include a match address and a match flag.*

*20. The priority encoder of claim 19, wherein the first priority match data includes the first priority value, and the second priority match data includes the second priority value.*

*21. The priority encoder of claim 18, wherein the logic circuitry includes a subtractor for subtracting the first priority value from the second priority value, the subtractor generating the first state of the control signal if a difference between the second priority value and the first priority value is greater than 0, the subtractor generating the second state of the control signal if the difference between the second priority value and the first priority value is less than or equal to 0.*

*22. The priority encoder of claim 21, further including a logical AND circuit having a first input for receiving the control signal and a second input for receiving a match flag corresponding to the second priority match data, the logical AND circuit passing the control signal if the match flag corresponds to a match condition for the second priority match data.*

*23. A method for providing a first priority match data and a second priority match data, comprising:*

*a) receiving a first priority value corresponding to the first priority match data and a second priority value corresponding to the second priority match data;*

*b) comparing the first priority value to the second priority value;*

*c) passing the first priority match data as the highest priority match data if the second priority value is greater than the first priority value; and*

*d) passing the second priority match data as the highest priority match data if the second priority value is less than or equal to the first priority value.*

*24. The method of claim 23, wherein comparing includes subtracting the first priority value from the second priority value.*

*25. The method of claim 24, wherein comparing further includes generating a first state of a control signal when the second priority value is greater than the first priority value, and generating a second state of the control signal when the second priority is less than or equal to the first priority value.*

*26. The method of claim 25, wherein passing includes passing the first priority match data in response to the first state of the control signal.*

*27. The method of claim 26, further comprising passing the control signal in response to a logical state of a match flag corresponding to the first priority match data.*

*28. The method of claim 27, wherein the control signal is passed with the first priority match data.*

*29. The method of claim 23, wherein the first priority match data and the second priority match data each include a match address and a match flag.*

*30. The method of claim 23, wherein the first priority match data includes the first priority value, and the second priority match data further includes the second priority value.*

*31. A system comprising:*

*a processor; and*

*a content addressable memory in communication with the processor, the content addressable memory comprising:*

*at least one memory block; and*

*a priority encoder having:*

*a priority register for receiving at least one priority value assigned by the processor; and*

*logic circuitry for receiving from the at least one memory block a first priority match data and a second priority match data,*

*the logic circuitry being responsive to the at least one priority value to selectively pass one of the first priority match data and the second priority match data.*

*32. The system of claim 31, wherein:*

*the logic circuitry is responsive to a first state of the at least one priority value to selectively pass the first priority match data; and*

*the logic circuitry is responsive to a second state of the at least one priority value to selectively pass the second priority match data.*

*33. The system of claim 31, wherein:*

*the at least one priority value comprises:*

*a first priority value corresponding to the first priority match data; and*

*a second priority value corresponding to the second priority match data; and*

*the logic circuitry being responsive to the at least one priority value comprises the logic circuitry being responsive to a difference between the first priority value and the second priority value.*

*34. The system of claim 33, wherein the first priority match data and the second priority match data each include a match address and a match flag.*

*35. The system of claim 34, wherein the first priority match data includes the first priority value, and the second priority match data includes the second priority value.*

*36. The system of claim 33, wherein the logic circuitry includes a subtractor for subtracting the first priority value from the second priority value, the logic circuitry passing the first priority match data if a difference between the second priority value and the first priority value is greater than 0, the logic circuitry passing the second priority match data if the difference between the second priority value and the first priority value is less than 0.*

*37. A content addressable memory comprising:*

*at least one memory block; and*

*a priority encoder for receiving from the at least one memory block a first priority match data and a second priority match data,*

*the priority encoder being responsive to at least one user-assigned priority value to select one of the first priority match data and the second priority match data.*

*38. The content addressable memory of claim 37, wherein:*

*the priority encoder is responsive to a first state of the at least one priority value to selectively pass the first priority match data; and*

*the priority encoder is responsive to a second state of the at least one priority value to selectively pass the second priority match data.*

*39. The content addressable memory of claim 37, wherein:*

*the at least one priority value comprises:*

*a first priority value corresponding to the first priority match data; and*

*a second priority value corresponding to the second priority match data; and*

*the priority encoder being responsive to the at least one priority value comprises the priority encoder being responsive to a difference between the first priority value and the second priority value.*

*40. The content addressable memory of claim 39, wherein the first priority match data and the second priority match data each include a match address and a match flag.*

*41. The content addressable memory of claim 40, wherein the first priority match data includes the first priority value, and the second priority match data includes the second priority value.*

*42. The content addressable memory of claim 39, wherein the priority encoder includes a subtractor for subtracting the first priority value from the second priority value, the priority encoder passing the first priority match data if a difference between the second priority value and the first priority value is greater than 0, the priority encoder passing the second priority match data if the difference between the second priority value and the first priority value is less than 0.*

*43. A content addressable memory comprising:*

*a plurality of data array blocks; and*

*a plurality of priority encoder blocks for receiving a plurality of match results from respective ones of the data array blocks,*

*each of the priority encoder blocks containing logic circuitry providing a priority selection algorithm for selecting a highest priority match result from the plurality of received match results based on a user-defined priority.*

*44. The content addressable memory of claim 43, wherein:*

*the logic circuitry is responsive to a first state of the at least one priority value to selectively pass the first priority match data; and*

*the logic circuitry is responsive to a second state of the at least one priority value to selectively pass the second priority match data.*

*45. The content addressable memory of claim 43, wherein:*

*the at least one priority value comprises:*

*a first priority value corresponding to the first priority match data; and*

*a second priority value corresponding to the second priority match data; and*

*the logic circuitry being responsive to the at least one priority value comprises the logic circuitry being responsive to a difference between the first priority value and the second priority value.*

*46. The content addressable memory of claim 45, wherein the first priority match data and the second priority match data each include a match address and a match flag.*

*47. The content addressable memory of claim 46, wherein the first priority match data includes the first priority value, and the second priority match data includes the second priority value.*

*48. The content addressable memory of claim 45, wherein the logic circuitry includes a subtractor for subtracting the first priority value from the second priority value, the logic circuitry passing the first priority match data if a difference between the second priority value and the first priority value*

*is greater than 0, the logic circuitry passing the second priority match data if the difference between the second priority value and the first priority value is less than 0.*

*49. A control circuit for a content addressable memory, the control circuit containing logic circuitry operative to:*

*a) receive a first priority value corresponding to the first priority match data and a second priority value corresponding to the second priority match data;*

*b) compare the first priority value to the second priority value;*

*c) pass the first priority match data as the highest priority match data if the second priority value is greater than the first priority value; and*

*d) pass the second priority match data as the highest priority match data if the second priority value is less than or equal to the first priority value.*

*50. The control circuit of claim 49, wherein:*

*the logic circuitry is responsive to a first state of the at least one priority value to selectively pass the first priority match data; and*

*the logic circuitry is responsive to a second state of the at least one priority value to selectively pass the second priority match data.*

*51. The control circuit of claim 49, wherein:*

*the at least one priority value comprises:*

*a first priority value corresponding to the first priority match data; and*

*a second priority value corresponding to the second priority match data; and*

*the logic circuitry being responsive to the at least one priority value comprises the logic circuitry being responsive to a difference between the first priority value and the second priority value.*

*52. The control circuit of claim 51, wherein the first priority match data and the second priority match data each include a match address and a match flag.*

*53. The content addressable memory of claim 52, wherein the first priority match data includes the first priority value, and the second priority match data includes the second priority value.*

*54. The control circuit of claim 51, wherein the logic circuitry includes a subtractor for subtracting the first priority value from the second priority value, the logic circuitry passing the first priority match data if a difference between the second priority value and the first priority value is greater than 0, the logic circuitry passing the second priority match data if the difference between the second priority value and the first priority value is less than 0.*

* * * * *